United States Patent
Lee

(10) Patent No.: US 10,150,015 B2
(45) Date of Patent: Dec. 11, 2018

(54) FRISBEE

(71) Applicant: ATake Digital Technology (Shenzhen) Co., Ltd., Shenzhen (CN)

(72) Inventor: Kuo-Tsai Lee, Taipei (TW)

(*) Notice: Subject to any disclaimer, the term of this patent is extended or adjusted under 35 U.S.C. 154(b) by 0 days.

(21) Appl. No.: 15/392,292

(22) Filed: Dec. 28, 2016

(65) Prior Publication Data
US 2018/0147455 A1  May 31, 2018

(30) Foreign Application Priority Data

Nov. 30, 2016  (CN) .................... 2016 2 1305544 U

(51) Int. Cl.
| | |
|---|---|
| A63B 37/00 | (2006.01) |
| A63B 39/00 | (2006.01) |
| A63B 41/00 | (2006.01) |
| A63B 65/00 | (2006.01) |
| A63B 43/06 | (2006.01) |
| A63B 43/00 | (2006.01) |
| H02J 7/00 | (2006.01) |
| H05K 1/14 | (2006.01) |
| F21V 33/00 | (2006.01) |

(52) U.S. Cl.
CPC ............ *A63B 43/004* (2013.01); *A63B 43/06* (2013.01); *F21V 33/008* (2013.01); *H02J 7/0042* (2013.01); *H05K 1/14* (2013.01); *H05K 2201/10113* (2013.01)

(58) Field of Classification Search
CPC ....... A63B 43/004; H04M 1/64; G08B 21/00; H04R 1/02; A63H 33/18
USPC .............. 473/570; 1/1; 446/46, 47; 310/90.5
See application file for complete search history.

(56) References Cited

U.S. PATENT DOCUMENTS

| | | | | |
|---|---|---|---|---|
| 4,869,699 | A * | 9/1989 | Plambeck | A63H 33/18 446/46 |
| 5,032,098 | A * | 7/1991 | Balogh | A63H 33/18 446/47 |
| 9,545,542 | B2 * | 1/2017 | Binder | A63H 33/18 |
| 2006/0183576 | A1 * | 8/2006 | Lindsey | A63H 33/18 473/570 |
| 2015/0079869 | A1 * | 3/2015 | Neth | A63H 33/18 446/46 |
| 2016/0150304 | A1 * | 5/2016 | Lee | H02K 7/09 310/90.5 |

* cited by examiner

*Primary Examiner* — Gene Kim
*Assistant Examiner* — Christopher Glenn
(74) *Attorney, Agent, or Firm* — Wayne & King LLC

(57) ABSTRACT

The present disclosure provides a frisbee, which includes a housing, and a base assembled to the housing, the frisbee further includes a speaker component assembled to the housing, and at least one light emitting component, the housing and the base cooperatively form a receiving space, the speaker component and the light emitting component are both received in the receiving space. When tossing, the frisbee of the present disclosure can deliver sound and light, which improves the fun of tossing.

1 Claim, 5 Drawing Sheets

FRISBEE

CROSS-REFERENCE TO RELATED APPLICATIONS

This application claims priority benefit of Chinese Patent Application No. 201621305544.X with a filing date of Nov. 30, 2016. The content of the aforementioned application, including any intervening amendments thereto, are incorporated herein by reference.

TECHNICAL FIELD

The present disclosure relates to the field of frisbee technologies.

BACKGROUND OF THE PRESENT INVENTION

The traditional frisbee can only be used to toss to provide fun to user, the function of is single. And, the traditional frisbee only has simple circle structure formed through a plastic injection method, such that the impact resistance of the traditional frisbee is weak.

SUMMARY OF PRESENT INVENTION

The main aim of the present disclosure is providing a frisbee, which aims to provide a frisbee having multi-functions.

In order to achieve the above aim, the frisbee of the present disclosure includes a housing, and a base assembled to the housing, the frisbee further including a speaker component assembled to the housing, and at least one light emitting component, the housing and the base cooperatively forming a receiving space, the speaker component and the light emitting component being both received in the receiving space.

Preferably, the frisbee further includes a printed circuit board, the speaker component is electrically connected with the printed circuit board, the light emitting component is located at the printed circuit board.

Preferably, the speaker component includes a supporter, and a speaker partly contained in the supporter; the hosing has a plurality of sound outlet holes, the supporter is connected with a surface of the housing facing the base, the speaker faces the sound outlet holes.

Preferably, the frisbee further includes a charging component electrically connected with the printed circuit board, the charging component includes a first cover and a second cover, the first cover covers the second cover, the first cover and the second cover cooperatively form a receiving cavity, the charging component further includes two magnetic elements and a connector, the magnetic elements are partly received in the receiving cavity, and pass through the second cover, the connector is partly received in the receiving cavity, and exposed from the first cover and/or the second cover.

Preferably, a surface of the housing away from the base has an accommodating groove, the charging component is partly received in the accommodating groove, a bottom of the accommodating groove has two through holes, the surface of the housing facing the base also includes two accommodating parts, each accommodating part is connected with one through hole; the frisbee further includes two charging posts, each charging post is received in one accommodating part, each magnetic element is partly contained in one receiving cavity and one accommodating part, and magnetically adsorbs with one charging post.

Preferably, the frisbee further includes a battery component electrically connected with the printed circuit board, the battery component includes a cover body, a substrate, and a battery clamped between the cover body and the substrate, the substrate is located at a surface of the base facing the housing.

Preferably, the frisbee further includes a key component electrically connected with the printed circuit board, the key component includes a key supporter and a key part located at the key supporter; the housing further has a via hole, the key part is received in the via hole, and exposed from the via hole.

Preferably, the printed circuit board includes a first printed circuit board and a second printed circuit board connected with the first printed circuit board, both of the first printed circuit board and the second printed circuit board have at least one light emitting component, the first printed circuit board is connected with a surface of the key supporter away from the key part.

Preferably, the housing has a first groove, the base has a second groove, the base is received in the first groove, the first groove and the second groove cooperatively form the receiving space.

Preferably, a lateral surface of the base is concavely provided with at least one concave part, the inner surface of the base has at least one protruding part which corresponds to the concave part; a periphery of the second groove and the protruding part are both connected with the housing.

Preferably, surfaces of the speaker, the printed circuit board, the charging component and the battery component are all coated with water-proof film, the water-proof film is made of polytetrafluoroethylene, thermoplastic polyurethane elastomer, or polyurethane.

Preferably, the housing and the base are both made of plastic.

The Beneficial effects of the present disclosure are: the speaker component located at the housing and the light emitting component are locate inside the frisbee of the present disclosure, so that during the tossing of the frisbee, the frisbee can deliverer sound and light for improving the fun of tossing, and the frisbee has a plurality of functions.

DESCRIPTION OF THE DRAWINGS

To illustrate the technical solutions according to the embodiments of the present invention or in the prior art more clearly, the accompanying drawings for describing the embodiments or the prior art are introduced briefly in the following. Apparently, the accompanying drawings in the following description are only about some embodiments of the present invention, and persons of ordinary skill in the art can derive other drawings from the accompanying drawings without creative efforts.

Labels illustration for drawings.

TABLE 1

| Label | Name | Label | Name |
|---|---|---|---|
| 100 | frisbee | 40 | printed circuit board |
| 10 | housing | 41 | first printed circuit board |
| 11 | third groove | 411 | connecting post |
| 113 | first groove | 43 | second printed circuit board |
| 1131 | clamping groove | 50 | light emitting component |
| 12 | connecting part | 60 | battery component |
| 13 | decorative hole | 61 | battery |
| 15 | accommodating groove | 63 | cover body |
| 151 | through hole | 65 | substrate |
| 153 | accommodating part | 70 | charging component |
| 16 | via hole | 71 | first cover |
| 17 | sound outlet hole | 73 | second cover |
| 18 | connecting groove | 75 | magnetic element |
| 20 | speaker component | 77 | connector |
| 21 | speaker | 79 | charging post |
| 23 | supporter | 80 | base |
| 30 | key component | 81 | protruding part |
| 31 | key part | 83 | second groove |
| 33 | key supporter | 85 | concave part |
| 331 | accommodating post | | |

The realizing of the aim, functional characteristics, advantages of the present disclosure are further described in detail with reference to the accompanying drawings and the embodiments.

DETAILED DESCRIPTION OF PREFERRED EMBODIMENTS

The technical solutions of the embodiments of the present disclosure will be clearly and completely described in the following with reference to the accompanying drawings. It is obvious that the embodiments to be described are only a part rather than all of the embodiments of the present invention. All other embodiments obtained by persons skilled in the art based on the embodiments of the present invention without creative efforts shall fall within the protection scope of the present invention.

It is to be understood that, all the directional instructions of in the present disclosure (such as top, down, left, right, front, back . . . ) can only be used for explaining relative position relations, moving condition of the elements under a special form (referring to figures), and so on, if the special form changes, the directional instructions changes accordingly.

In addition, the descriptions, such as the "first", the "second" in the present disclosure, can only be used for describing the aim of description, and cannot be understood as indicating or suggesting relative importance or impliedly indicating the number of the indicated technical character. Therefore, the character indicated by the "first", the "second" can express or impliedly include at least one character. In addition, the technical proposal of each exemplary embodiment can be combined with each other, however the technical proposal must base on that the ordinary skill in that art can realize the technical proposal, when the combination of the technical proposals occurs contradiction or cannot realize, it should consider that the combination of the technical proposals does not existed, and is not contained in the protection scope required by the present disclosure.

Figure 1:
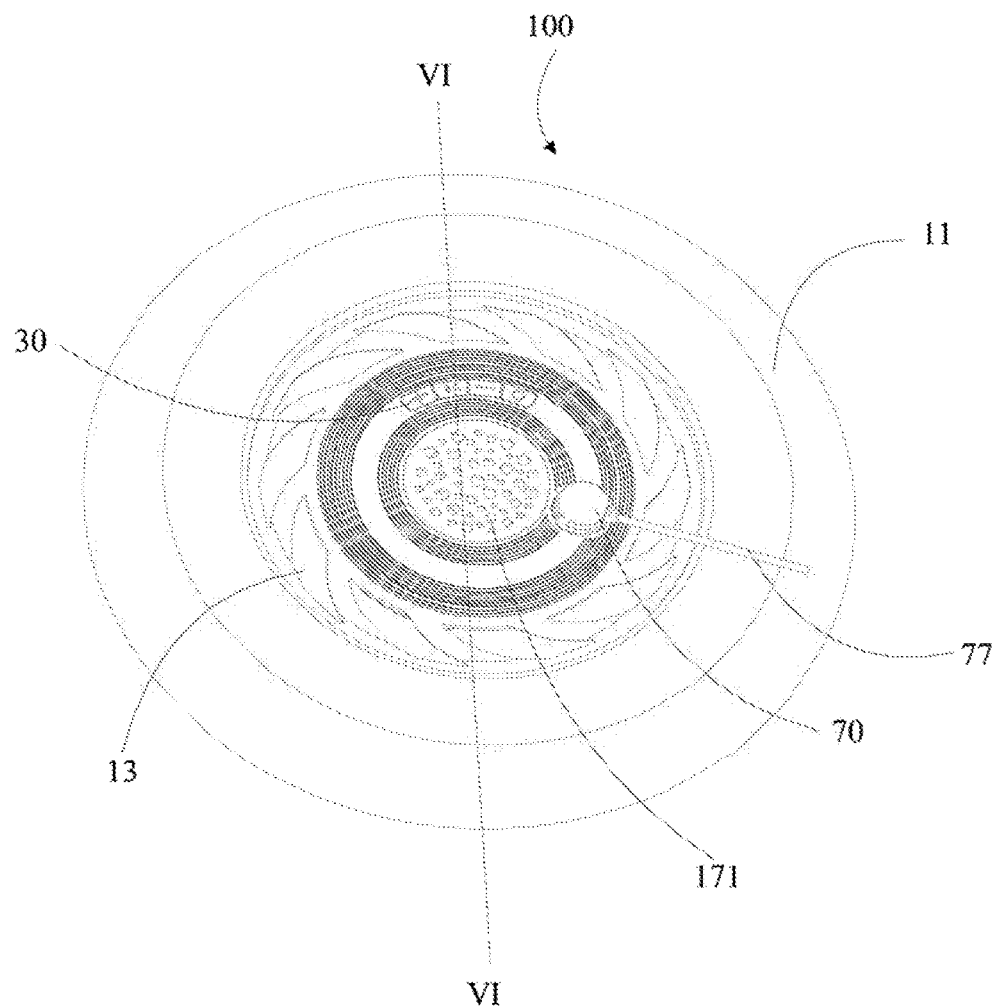
FIG. 1 is a structure diagram of a frisbee provided by an exemplary embodiment of the present disclosure.
Figure 2:
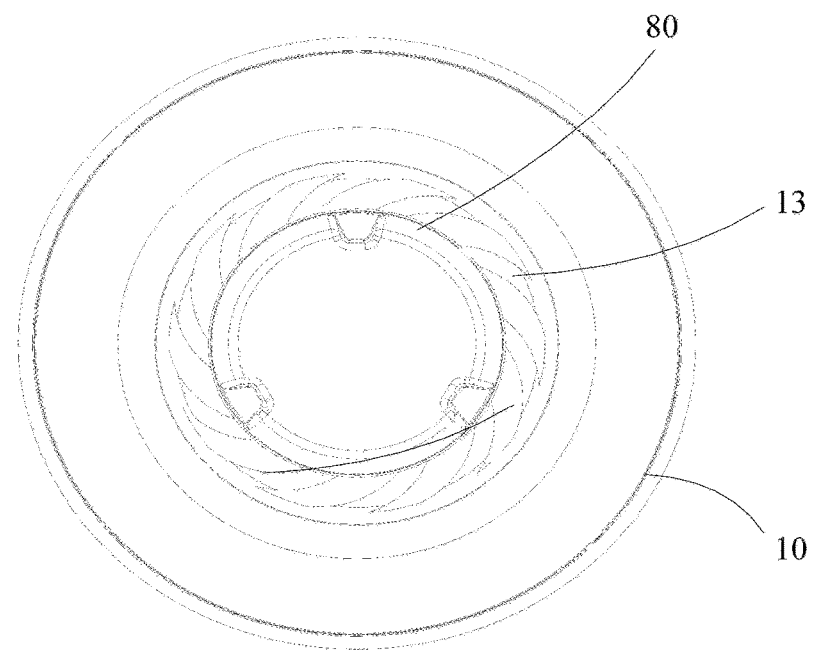
FIG. 2 is another structure diagram of the frisbee shown in FIG. 1 from another view.
Figure 3:
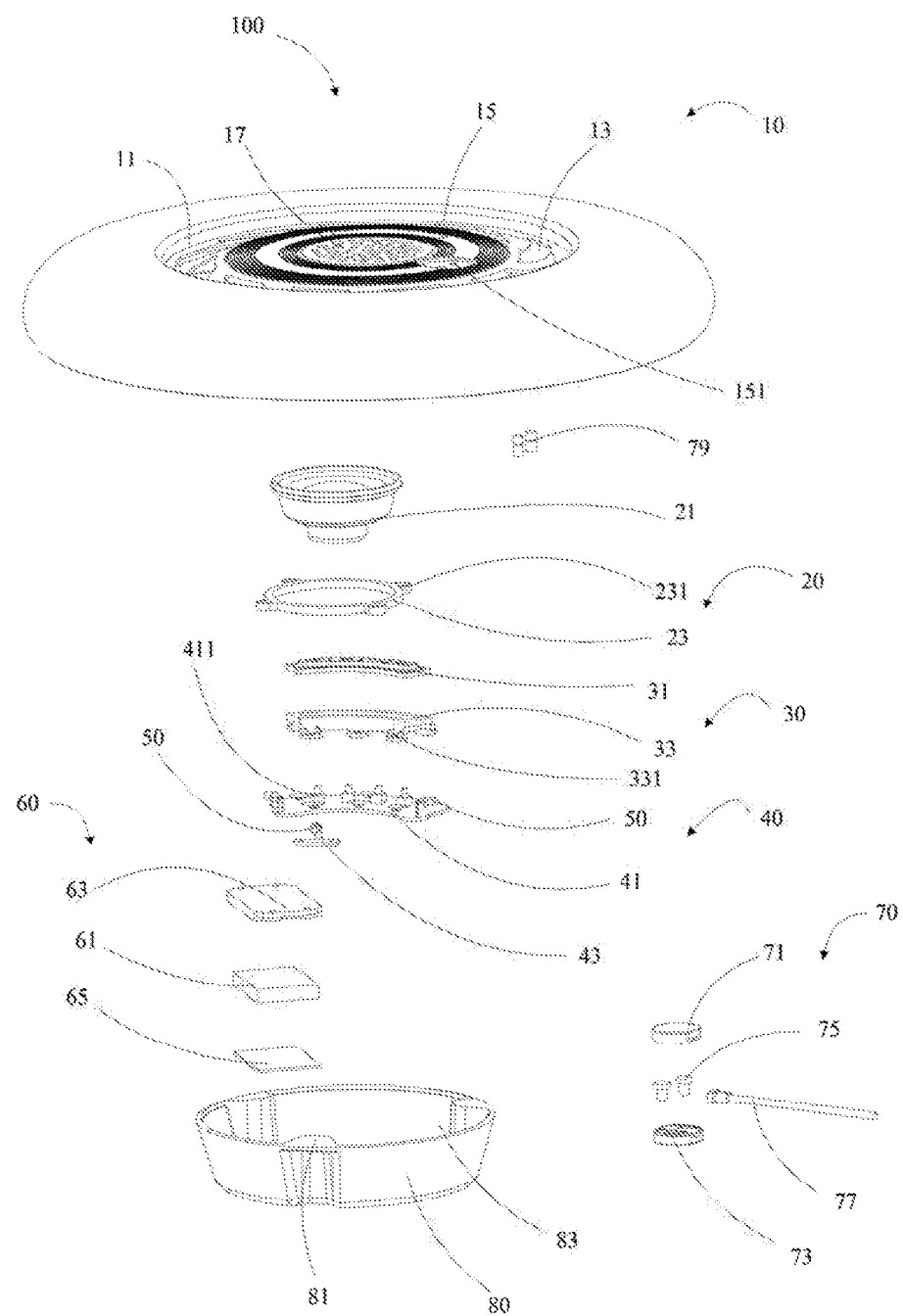
FIG. 3 is an exploded diagram of the frisbee shown in FIG. 1.
Figure 4:
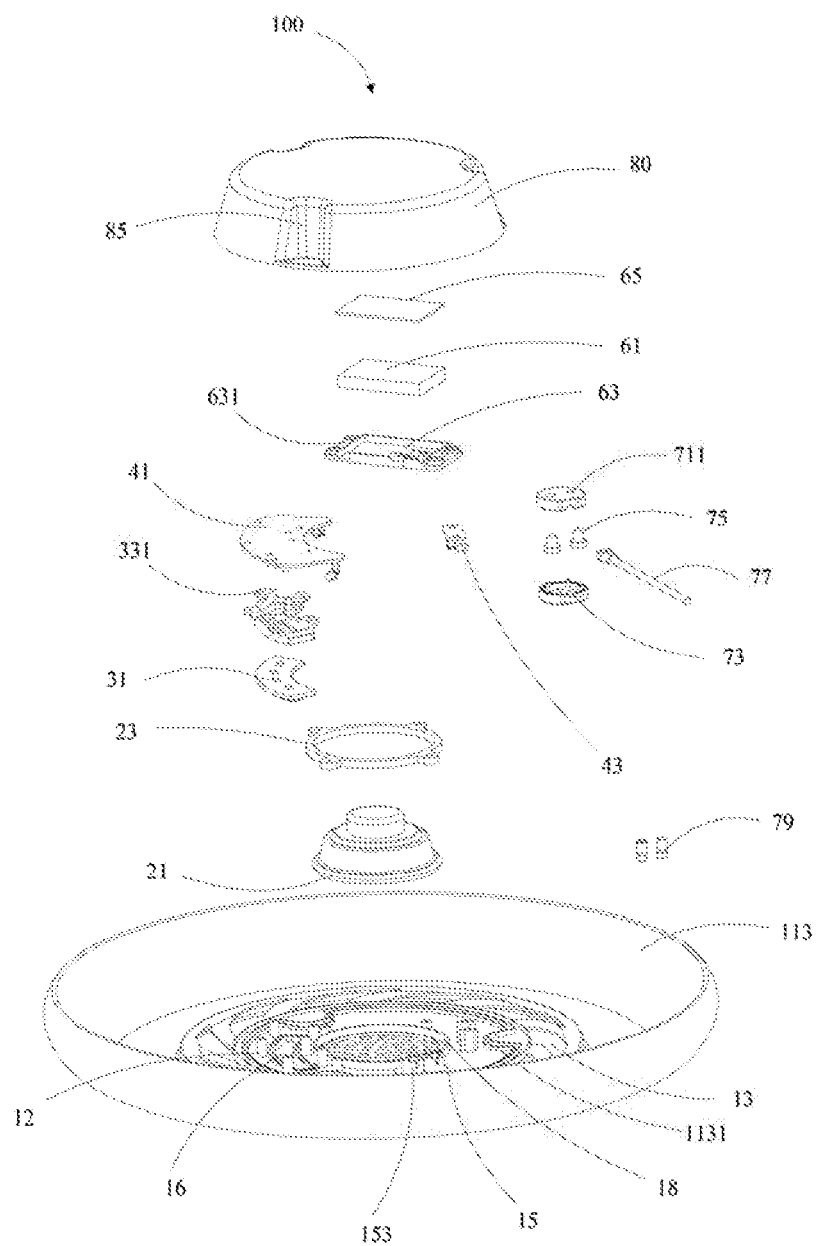
FIG. 4 is another exploded diagram of the frisbee shown in FIG. 1 from another view.
Figure 5:
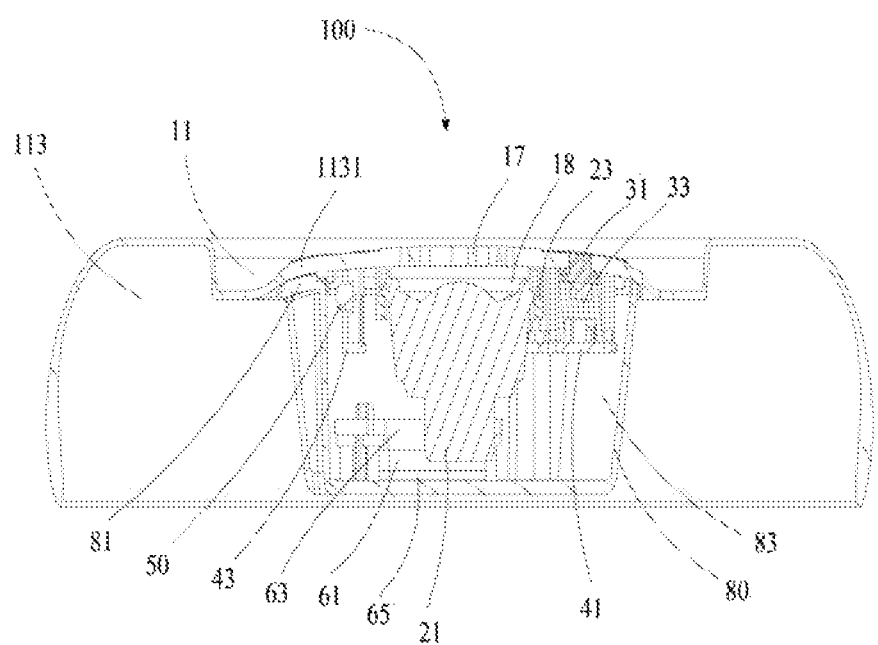
FIG. 5 is section diagram of the frisbee shown in FIG. 1 along VI-VI line.

Referring to FIGS. 1-5, the present disclosure provides a frisbee 100.

The frisbee 100 includes a housing 10, and a base 80 assembled to the housing 10, the frisbee 100 further includes a speaker component 20 assembled to the housing 10, and at least one light emitting component 50, the housing 10 and the base 80 cooperatively form a receiving space, the speaker component 20 and the light emitting component 50 are both received in the receiving space.

A surface of the housing away from the base 80 is concavely provided with a third groove 11. A bottom surface of the third groove 11 has a plurality of decorative holes 13, positions, shapes and sizes of the decorative holes 13 can be adjusted according to the actual production needs. In the exemplary embodiment, the decorative holes 13 are arranged in radial structure, for providing the frisbee better appearance.

The present disclosure sets the speaker component 20 and the light emitting component 50 inside the frisbee 100, so that when tossing the frisbee 100, the frisbee 100 can deliverer sound and light, the frisbee 100 has a plurality of functions, and the fun of tossing is improved.

The frisbee 100 includes a printed circuit board 40, the speaker component 20 is electrically connected with the printed circuit board 40, the light emitting component 50 is located at the printed circuit board 40.

The frisbee 100 of the present disclosure further has the printed circuit board 40, the speaker component 20 is electrically connected with the printed circuit board 40, so that the speaker component 20 can send out sound. At the same time, the light emitting component 50 is located at the printed circuit board 40, so that the light emitting component 50 can emit light. At the same time, the light emitting component 50 is located inside the housing, during the tossing of the frisbee 100, the housing 10 can protect the light emitting component 50 from damaging.

The speaker component 20 includes a supporter 23, and a speaker 21 partly contained in the supporter 23; the hosing 10 has a plurality of sound outlet holes 17, the supporter 23 is connected with a surface of the housing 10 facing the base 80, the speaker 21 faces the sound outlet holes 17.

In the exemplary embodiment, the sound outlet holes 17 are formed at the bottom wall of the third groove 11. A surface of the housing facing the base 80 protrudes a connecting groove 18, the sound outlet holes 17 pass through the bottom wall of the third groove 11, the supporter 23 is connected with the periphery of the connecting groove 18, the speaker 21 is received in the connecting groove 18, and faces the sound outlet holes 17.

The speaker 21 of the present disclosure is connected with the housing 1—through the supporter 23, at the same time, the sound outlet holes of the speaker 21 faces the sound outlet holes 17 of the housing 10, so that the speaker 21 has better tone quality.

The frisbee 100 further includes a charging component 70 electrically connected with the printed circuit board 40, the charging component 70 includes a first cover 71 and a second cover 73, the first cover 71 covers the second cover 73, the first cover 71 and the second cover 73 cooperatively form a receiving cavity, the charging component 70 further includes two magnetic elements 75 and a connector 77, the magnetic elements 75 are partly received in the receiving cavity, and pass through the second cover 73, the connector 77 is partly received in the receiving cavity, and exposed from the first cover 71 and the second cover 73.

The magnetic elements 75 can be magnet.

The surface of the housing 10 away from the base 80 has an accommodating groove 15, the charging component 70 is partly received in the accommodating groove 15, a bottom of the accommodating groove 15 has two through holes 151, the surface of the housing 10 facing the base 80 also includes two accommodating parts 153, each accommodating part 153 is connected with one through hole 151; the frisbee 100 further includes two charging posts 79, each charging post 79 is received in one accommodating part 153, each magnetic element 75 is partly contained in one receiving cavity and one accommodating part 153, and magnetically adsorbs with one charging post 79.

The charging component 70 of the present disclosure is located inside the accommodating groove 15 of the housing 10, and partly exposed from the accommodating groove 15, after two magnetic element 75 of the charging component 70 pass through the second cover 73, two magnetic element 75 are received in the accommodating part 153, and magnetically adsorb with charging posts 79 respectively; after the connector 77 of the charging component 70 passes through the first cover 71 and/or the second cover 73, the connector 77 is exposed from the housing 10, so that the connector 77 can be connected with external power supply, for charging the charging component 70.

The frisbee 100 further includes a battery component 60 electrically connected with the printed circuit board 40, the battery component 60 includes a cover body 63, a substrate 65, and a battery 61 clamped between the cover body 63 and the substrate 65, the substrate 65 is located at a surface of the base 80 facing the housing 10.

The substrate 65 can be ethylene-vinyl acetate copolymer (EVA), the substrate 65 has the function of absorbing shock.

The cover body 63 has a plurality of connecting members, the cover body 63 can be fixed with the base 80 through the connecting members, so that the battery component 60 can be fixed with the base 80.

The battery component 60 of the present disclosure can be connected with the printed circuit board 40, the battery component 60 is fixed with the surface of the base 80 facing the housing 10, so that the battery component 60 can be firmly contained in the receiving space. The battery component 60 supplies powers for the frisbee 100.

The frisbee 100 further includes a key component 30 electrically connected with the printed circuit board 40, the key component 30 includes a key supporter 33 and a key part 31 located at the key supporter 33; the housing 10 further has a via hole 16, the key part 31 is received in the via hole 16, and exposed from the via hole 16.

In detail, the key part 31 can include a plurality of keys, such as, starting key, stopping key, forward key, back Key, increasing key, decreasing key, pause key, and so on.

The key supporter 33 has at least one accommodating post 331, one screw can pass through one accommodating post and connect with the housing 10, so that the key supporter 33 and the key part 31 can be fixed with the housing 10.

The key part 31 of the present disclosure can be exposed from the via hole 16, so that user can operate the frisbee 100 through the key part 31. At the same time, the key part 31 can be connected with the housing through the key supporter 33.

The printed circuit board 40 includes a first printed circuit board 41 and a second printed circuit board 43 connected with the first printed circuit board 41, both of the first printed circuit board 41 and the second printed circuit board 43 have at least one light emitting component 50, the first printed circuit board 41 is connected with a surface of the key supporter 33 away from the key part 31.

The first printed circuit board 41 has at least one connecting post 411, the key supporter 33 has at least one accommodating post 331, the accommodating post 331 has a hollow structure, the surface of the housing facing the base 80 has at least one connecting part 12, the connecting part 12 and the connecting post 411 are both clamped in the accommodating post 331, so that the first printed circuit board 41 and the key supporter 33 are both connected with the housing 10.

The second printed circuit board 43 is connected with the surface of the housing 10 facing the base 80.

The printed circuit board 40 of the present disclosure includes the first printed circuit board 41 and the second printed circuit board 43 connected with the first printed circuit board 41, both of the first printed circuit board 41 and the second printed circuit board 43 have at least one light emitting component 50, so that the light emitting components 50 are uniformly arranged in the housing 10, so that the frisbee 100 can has better light effect.

The housing 10 has a first groove 113, the base 80 has a second groove 83, the base 80 is received in the first groove 113, the first groove 113 and the second groove 83 cooperatively form the receiving space.

The housing 10 of the present disclosure has the first groove 113, the base 80 has the second groove 83, the first groove 113 and the second groove 83 cooperatively form the receiving space, so that when tossing the frisbee 100, the frisbee 100 would not be damaged. At the same time, the base 80 is received in the first groove 113, so that the housing 10 wraps the base 80 for protecting the base 80, so that the impact resistant ability of the frisbee 100 is improved.

A lateral surface of the base 80 is concavely provided with at least one concave part 85, the inner surface of the base 80 has at least one protruding part 81 which corresponds to the concave part 85; a periphery of the second groove 83 and the protruding part 81 are both connected with the housing 10.

A bottom wall of the first groove 113 has at least one clamping groove 1131, one protruding part 81 is received in one clamping groove 1131.

The periphery of the second groove 83 of the present disclosure is connected with the surface of the housing 10 facing the base 80 through the glue, so that the base 80 is connected with the housing 10. At the same time, the base 80 has at least one protruding part 81, the protruding part 81 can be connected with the surface of the housing 10 facing the base 80 through the glue, for improving the contacting area of the base 80 and the housing 10, so the connecting force between the housing 10 and the base 80 is stronger. And the frisbee 100 has better impact resistant ability.

Surfaces of the speaker 21, the printed circuit board 40, the charging component 70 and the battery component 60 are all coated with water-proof film (not shown), the water-proof film is made of polytetrafluoroethylene, thermoplastic polyurethane elastomer, or polyurethane.

The speaker 21, the printed circuit board 40, the charging component 70 and the battery component 60 are all coated with water-proof film, so that speaker 21, the printed circuit board 40, the charging component 70 and the battery component 60 are water-proofing. Even if the frisbee 100 falls into water during tossing, the speaker 21, water would fill in the printed circuit board 40, the charging component 70 and the battery component 60, and the printed circuit board 40, the charging component 70 and the battery component 60 will not be damaged by filling water.

The housing 10 and the base 80 are both made of plastic.

The plastic can be thermoplastic polyurethanes (TPU), polypropylene (PP), polyethylene terephthalate (PET), polyvinyl chloride (PVC), and so on.

The housing 10 and the base 80 are translucence or transparent, so that the light emitted from the light emitting component 50 can pass through the housing 10 and the base 80.

The housing 10 and the base 80 of the present disclosure are made of translucence plastic or transparent plastic, at the same time, the hardness of the plastic is low, so that the impact resistant ability of the frisbee 100 is improved, meanwhile, the light emitted from the light emitting component 50 can pass through the translucence plastic or transparent plastic, for providing the frisbee 100 better appearance.

The embodiments above are preferably embodiments of the present disclosure, and the present disclosure is not limited to such embodiments, equivalent structure conversion based on the specification and the drawing of the present disclosure, or directly or indirectly used in other related technical field, both similarly within the protection scope of the present disclosure.

I claim:

1. A frisbee, comprising a housing, and a base assembled to the housing, the frisbee further comprising a speaker component assembled to the housing, and at least one light emitting component, the housing and the base cooperatively forming a receiving space, the speaker component and the light emitting component being both received in the receiving space; wherein the housing has a first groove, the base has a second groove, the base is received in the first groove, the first groove and the second groove cooperatively form the receiving space; and the housing wraps the base, the frisbee further comprises a printed circuit board, the speaker component is electrically connected with the printed circuit board, the light emitting component is located at the printed circuit board, the frisbee further comprises a charging component electrically connected with the printed circuit board, the charging component comprises a first cover and a second cover, the first cover covers the second cover, the first cover and the second cover cooperatively form a receiving cavity, the charging component further comprises two magnetic elements and a connector, the magnetic elements are partly received in the receiving cavity, and pass through the second cover, the connector is partly received in the receiving cavity, and exposed from the first cover and/or the second cover, a surface of the housing away from the base has an accommodating groove, the charging component is partly received in the accommodating groove, a bottom of the accommodating groove has two through holes, the surface of the housing facing the base also comprises two accommodating parts, each accommodating part is connected with one through hole; the frisbee further comprises two charging posts, each charging post is received in one accommodating part, each magnetic element is partly contained in one receiving cavity and one accommodating part, and magnetically absorbs with one charging post; the connector is exposed from the housing.

* * * * *